United States Patent [19]
Romriell

[11] Patent Number: 5,848,195
[45] Date of Patent: Dec. 8, 1998

[54] SELECTION OF HUFFMAN TABLES FOR SIGNAL ENCODING

[75] Inventor: Joseph N. Romriell, Hillsboro, Oreg.

[73] Assignee: Intel Corporation, Santa Clara, Calif.

[21] Appl. No.: 568,021

[22] Filed: Dec. 6, 1995

[51] Int. Cl.⁶ .................................................. H04N 1/41
[52] U.S. Cl. ...................... 382/246; 382/232; 382/168; 358/427; 358/426
[58] Field of Search ........................ 382/232, 246, 382/239, 168, 172, 254; 358/522, 427, 261.1, 426; 348/403, 404, 405, 419, 420, 397; 375/246, 240; 341/67, 106

[56] References Cited

U.S. PATENT DOCUMENTS

| | | | |
|---|---|---|---|
| 3,883,847 | 5/1975 | Frank | 395/416 |
| 4,369,463 | 1/1983 | Anastassiou | 348/411 |
| 4,386,416 | 5/1983 | Giltner | 395/888 |
| 4,396,906 | 8/1983 | Weaver | 341/65 |
| 4,563,671 | 1/1986 | Lim et al. | 358/261.1 |
| 4,574,382 | 3/1986 | Ko | 375/253 |
| 4,580,162 | 4/1986 | Mori | 348/400 |
| 4,593,267 | 6/1986 | Kuroda et al. | 341/67 |
| 4,700,175 | 10/1987 | Bledsoe | 341/65 |
| 4,706,265 | 11/1987 | Furukawa | 375/241 |
| 4,813,056 | 3/1989 | Fedele | 375/246 |
| 4,899,149 | 2/1990 | Kahan | 341/67 |
| 4,967,196 | 10/1990 | Sprague et al. | 341/67 |
| 4,992,889 | 2/1991 | Yamagami et al. | 358/430 |
| 5,045,853 | 9/1991 | Astle et al. | 341/67 |
| 5,057,917 | 10/1991 | Shalkauser et al. | 348/409 |
| 5,214,507 | 5/1993 | Aravind et al. | 382/239 |
| 5,220,325 | 6/1993 | Ackland et al. | 341/67 |
| 5,268,769 | 12/1993 | Tsuchiya et al. | 358/427 |
| 5,304,995 | 4/1994 | Dachiku | 341/67 |
| 5,329,313 | 7/1994 | Keith | 348/422 |
| 5,517,581 | 5/1996 | Johnston et al. | 382/232 |
| 5,528,628 | 6/1996 | Park et al. | 375/240 |
| 5,566,001 | 10/1996 | Saidi et al. | 382/246 |
| 5,623,557 | 4/1997 | Shimoyoshi | 382/246 |

FOREIGN PATENT DOCUMENTS

| | | |
|---|---|---|
| 0145396 | 6/1985 | European Pat. Off. . |
| WO89/05556 | 6/1989 | European Pat. Off. . |
| 117564 | 9/1988 | Japan . |
| 112839 | 7/1994 | Japan . |
| 237448 | 11/1994 | Japan . |

OTHER PUBLICATIONS

"DVI Image Compression—Second Generation," by Stuart J. Golin, Image Processing Algorithms and Techniques III, SPIE vol. 1657, Proceedings of the International Society for Optical Engineering, 1992, pp. 106–113.

Abramson, N., Information Theory and Coding, McGraw–Hill 1963, pp. 77–92.

"The i750 Video Processor: A Total Multimedia Solution," Communications of the ACM, vol. 34, No. 4, Apr. 1991, New York, pp. 64–78.

Patent Abstracts of Japan, vol. 11, No. 83, (E–489) (2530), Mar. 13, 1987, entitled "Data Processing Method" and JP,A61237520 (Canon, Inc.) 22 Oct. 1986.

*Primary Examiner*—Edward L. Coles
*Assistant Examiner*—Cheukfan Lee
*Attorney, Agent, or Firm*—William H. Murray, Esq.; N. Stephan Kinsella, Esq.

[57] ABSTRACT

Selecting a Huffman table to encode a set of signals, such as video signals, from a set of predefined Huffman tables. A histogram is generated for the set of signals and used to determine the number of bits to encode the set of signals for each of the predefined Huffman tables. The Huffman table that provides the smallest number of bits to encode is selected for encoding the set of signals into the encoded bitstream. In a preferred embodiment, a dynamic Huffman table is also generated for the set of signals and used to estimate the number of bits to encode the set of signals including the number of bits to encode the dynamic Huffman table. If using the dynamic Huffman table results in fewer bits in the encoded bitstream, then the dynamic Huffman table is used (and explicitly encoded in the bitstream) instead of the selected predefined Huffman table.

21 Claims, 12 Drawing Sheets

FIG. 1. ENCODING SYSTEM

FIG. 2. DECODING SYSTEM

FIG. 3. COMPRESSION PROCESSING

FIG. 5. ENCODER

FIG. 6. ENCODE PROCESSING

FIG. 7. DECOMPRESSION PROCESSING

FIG. 9. DECODE PROCESSING

SELECTION OF HUFFMAN TABLES FOR SIGNAL ENCODING

CROSS-REFERENCES TO RELATED APPLICATIONS

This application is related to U.S. patent application Ser. No. 08/558,258, filed Nov. 13, 1995, now U.S. Pat. No. 5,646,618, issued Jul. 8, 1996, the teachings of which are incorporated herein by reference.

BACKGROUND OF THE INVENTION

1. Field of the Invention

The present invention relates to signal processing, and, in particular, to encoding signals such as video signals using variable-length encoding.

2. Description of the Related Art

Signal compression is desirable in many situations where much data need to be stored in limited memory space and/or transmitted through limited bandwidth paths. Huffman coding, also known as variable-length or statistical encoding, may be effectively used to compress streams of fixed-length signals that have a statistical distribution that is not uniform. In Huffman coding, each signal value is mapped to a particular variable-length (VL) code in a specified codebook (or table). By encoding signal values that are statistically more likely to occur using relatively short VL codes (i.e., having relatively few bits), and conversely by reserving longer VL codes for infrequently occurring signal values, the total number of bits used to represent the signals stream can be reduced.

In theory, for a given set of signals, there is a particular generalized Huffman codebook that can be generated from the statistics for that set of signals, which will optimally encode that set of signals. The optimal Huffman codebook can be generated directly from a histogram of the signal values present in the particular set.

Where the signals to be encoded have roughly constant statistics, both over the short term and over the long term, a single Huffman codebook may be effectively employed to compress the signals. In such a case, both the encoder and the decoder can be pre-programmed to use the same agreed-upon codebook.

In some applications, however, such as video encoding, the signal statistics may vary significantly from video sequence to video sequence, and even within a video sequence. If the statistics of the signals to be encoded vary sufficiently from the statistics of the Huffman codebook, the signals will not be optimally encoded using that Huffman codebook. In fact, in extreme cases, the encoded variable-length codes take up more bits than the original fixed-length signals. such situations of varying signal statistics, one approach is to generate a different Huffman codebook for each set of signals (e.g., for each video frame) and then explicitly encode the codebook into the bitstream along with the VL codes generated using the codebook to encode that set of signals. A decoder can then recover the Huffman codebook from the bitstream and use it to decode and recover the original fixed-length signals.

One disadvantage of this approach is that explicitly encoding the codebook into the bitstream can require a relatively large number of bits. Unless the bit-length savings gained from using the codebook to convert the fixed-length signals into VL codes are greater than the number of bits required to explicitly encode the codebook into the bitstream, such an approach will not provide signal compression. Even if compression is achieved, it is still undesirable to have to encode the codebook explicitly into the bitstream.

Another disadvantage is that the decoder must spend processing cycles recreating the codebook from the bitstream. This is especially true when the codebook is itself encoded to reduce the cost of explicitly including it in the bitstream.

Another approach is to have a finite number of predefined Huffman tables known to both the encoder and the decoder. For each set of signals, the encoder will select one of the predefined Huffman tables to encode the signals and the selected table will be explicitly identified in the bitstream (e.g., by a table number). The table can be changed for each different set of signals encoded simply by indicating the new table number in the bitstream. The decoder will recover the table number from the bitstream to know which predefined table to use to decode the VL codes in the bitstream.

Under some compression schemes that employ variable-length encoding, the set of Huffman tables are created by correlating each table with a value or set of values from the encoding algorithm which vary the statistics of the output symbols. The statistics for the symbols are gathered for each statistics-modifying value or set of values and are combined into one frequency distribution. The final Huffman table is created from this distribution.

For example, suppose a simple lossy image coding system is created, which takes an image as its input and generates a pixel prediction from a previous pixel. Assume further that the system quantizes the prediction error based on a target quality. In tuning this algorithm, it would be quickly found that as the quantization level increases, the statistics become more skewed or Laplacian shaped. In this example, the quantization level is the statistics-varying parameter and Huffman tables are mapped such that, given a quantization level, a Huffman table is chosen from a set of tables. The table set is created by gathering statistics for each quantization level or range of quantization levels which a given Huffman table would represent. An optimal table is then created from the gathered statistics. In addition to quantization level, Huffman tables can also be generated using other statistics-varying parameters, such as tree level for a tree-search vector-quantization algorithm, and/or truncation value for a zero-truncation algorithm.

Another method used to create a set of Huffman tables is to take an expected frequency distribution and artificially perturb that distribution to create a set of distributions. A Huffman table is then created for each distribution.

These methods often fail to provide a set of Huffman tables that efficiently codes the signals to be encoded during on-line processing.

What is needed is a method for generating a set of Huffman tables to be used by both the encoder and the decoder to encode and decode efficiently, if not optimally, all of the differing signals in the streams of signals to be encoded. Also needed is a method for selecting a particular table from a set of predefined Huffman tables to use to encode each different set of signals in the stream.

It is accordingly an object of this invention to overcome the disadvantages and drawbacks of the known art and to provide methods for generating Huffman tables for use in encoded signals, such as video signals.

It is also an object of this invention to provide methods for selecting Huffman tables from a set of predefined tables for use in encoding particular sets of signals.

Further objects and advantages of this invention will become apparent from the detailed description of a preferred embodiment which follows.

SUMMARY OF THE INVENTION

The present invention comprises computer-implemented processes, apparatuses, and storage mediums encoded with machine-readable computer program code for encoding signals. According to a preferred embodiment, a histogram is generated for a set of signals. The histogram is used to select a Huffman table from a set of two or more predefined Huffman tables. The set of signals is variable-length encoded based on the selected Huffman table, and an encoded bitstream is generated from the variable-length encoded signals.

BRIEF DESCRIPTION OF THE DRAWINGS

Other objects, features, and advantages of the present invention will become more fully apparent from the following detailed description of the preferred embodiment, the appended claims, and the accompanying drawings in which:

DESCRIPTION OF THE PREFERRED EMBODIMENT(S)

According to a preferred embodiment of the present invention, a set of predefined Huffman tables are generated using an off-line training process. For each set of signals, such as video signals, to be encoded, a Huffman table is selected from the set of predefined Huffman tables and used to encode the set of signals during on-line processing.

Hardware Architectures

Figure 1:
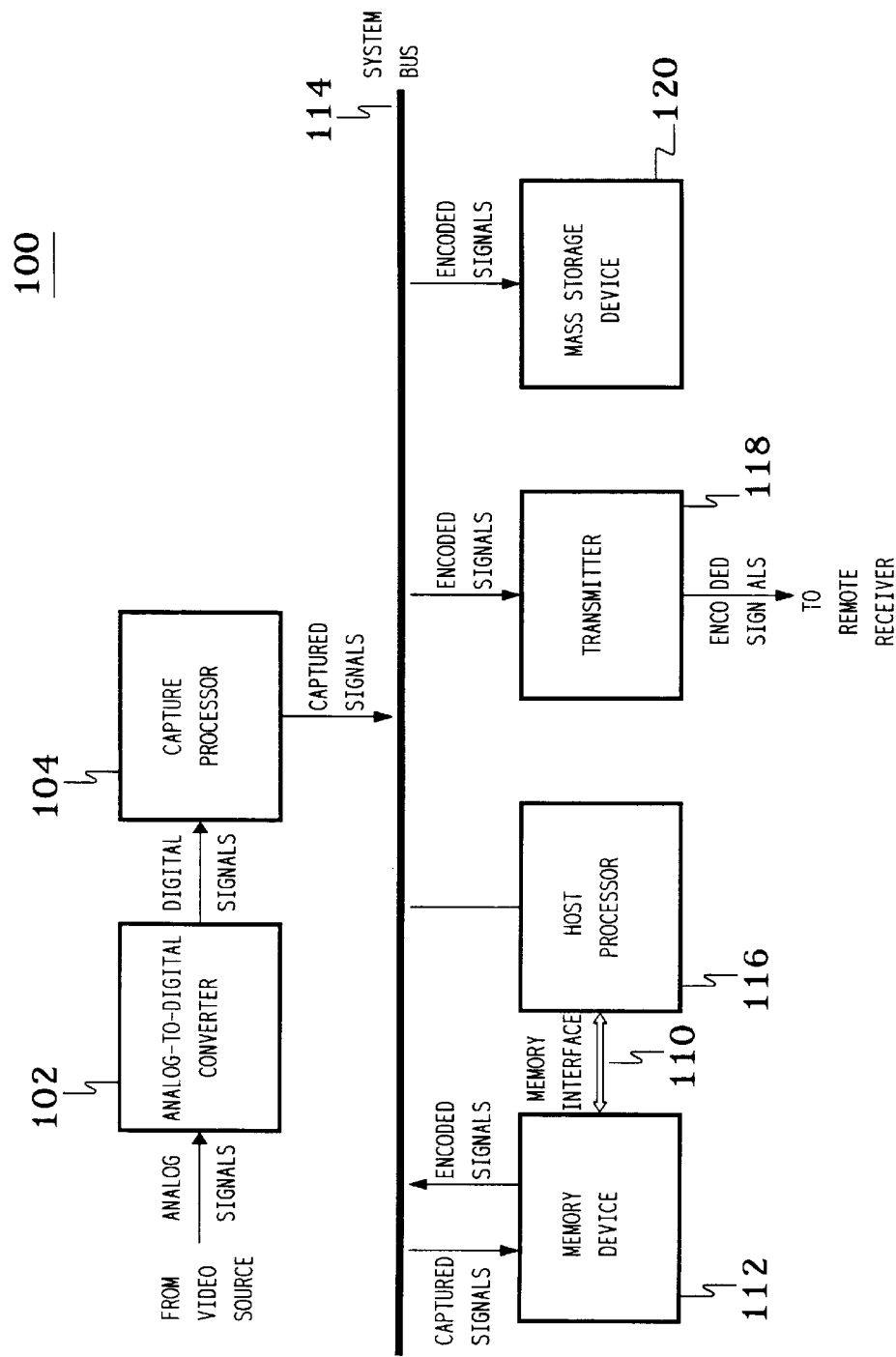
FIG. 1 is a block diagram of a video system for encoding video signals in a PC environment, according to a preferred embodiment of the present invention.

Referring now to FIG. 1, there is shown a computer system 100 for encoding video signals, according to a preferred embodiment of the present invention. Analog-to-digital (A/D) converter 102 of encoding system 100 receives analog video signals from a video source. The video source may be any suitable source of analog video signals such as a video camera or VCR for generating local analog video signals or a video cable or antenna for receiving analog video signals from a remote source. A/D converter 102 decodes (i.e., separates the signal into constituent components) and digitizes the analog video signals into digital video component signals (e.g., in one embodiment, 8-bit R, G, and B component signals).

Capture processor 104 captures the digitized component signals received from converter 102. Capturing may include one or more of color conversion (e.g., RGB to YUV), scaling, and subsampling. Each captured video frame is represented by a set of three two-dimensional component planes, one for each component of the digitized video signals. In one embodiment, capture processor 104 captures video signals in a YUV9 (i.e., YUV 4:1:1) format, in which every (4×4) block of pixels of the Y-component plane corresponds to a single pixel in the U-component plane and a single pixel in the V-component plane. Capture processor 104 selectively stores the captured signals to memory device 112 and/or mass storage device 120 via system bus 114. Those skilled in the art will understand that, for real-time encoding, the captured signals are preferably stored to memory device 112, while for non-real-time encoding, the captured signals are preferably stored to mass storage device 120.

During real-time encoding, host processor 116 reads the captured bitmaps from memory device 112 via high-speed memory interface 110 and generates encoded video signals that represent the captured video signals. Depending upon the particular encoding scheme implemented, host processor 116 applies a sequence of compression steps to reduce the amount of data used to represent the information in the video signals. The encoded video signals are then stored to memory device 112 via memory interface 110, and/or mass storage device 120 via system bus 114. Host processor 116 may copy the encoded video signals to mass storage device 120 and/or transmit the encoded video signals to transmitter 118 for real-time transmission to a remote receiver (not shown in FIG. 1).

Figure 2:
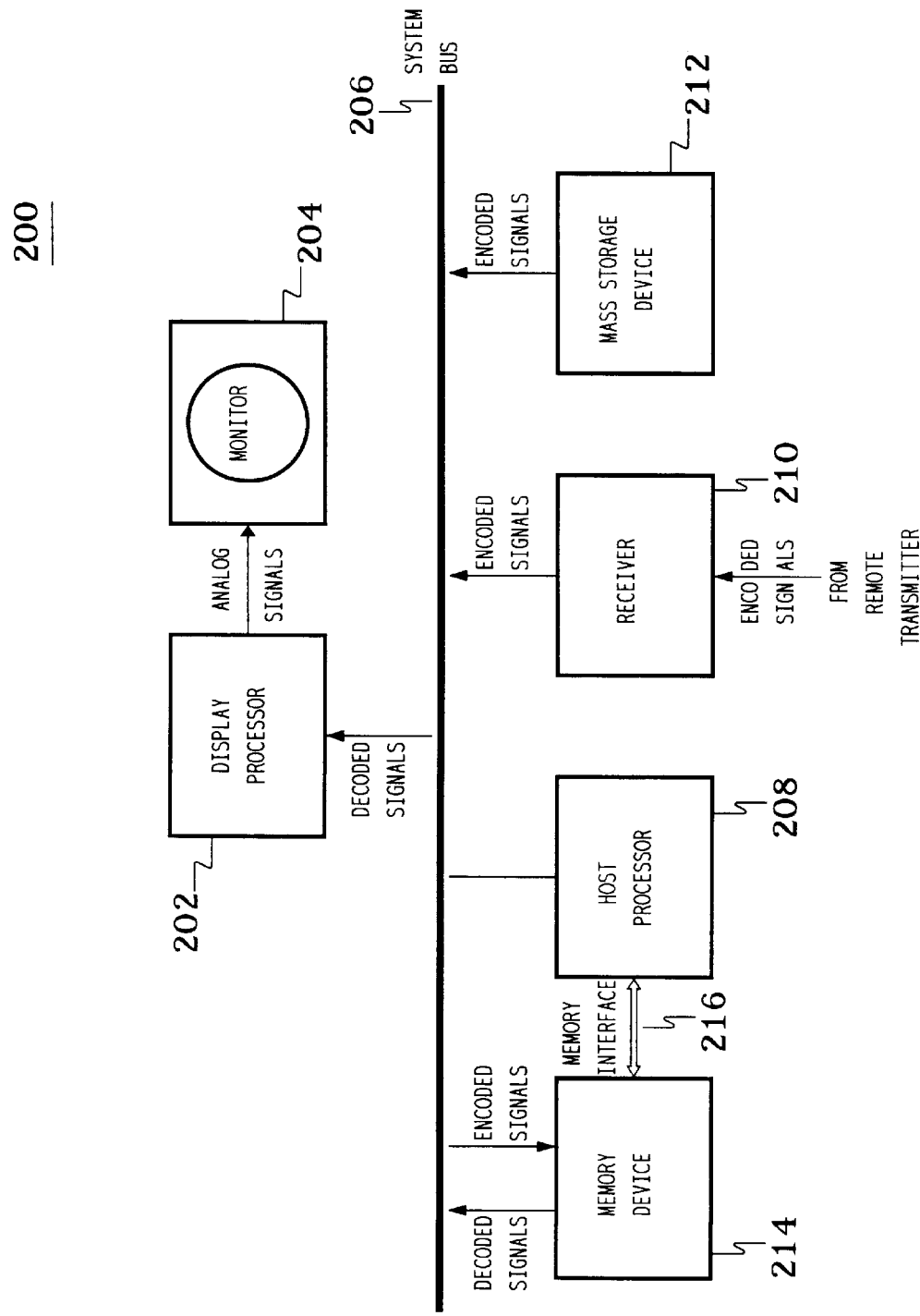
FIG. 2 is a computer system for decoding the video signals encoded by the computer system of FIG. 1, according to a preferred embodiment of the present invention.

Referring now to FIG. 2, there is shown a computer system 200 for decoding the video signals encoded by encoding system 100 of FIG. 1, according to a preferred embodiment of the present invention. Encoded video signals are either read from mass storage device 212 of decoding system 200 or received by receiver 210 from a remote transmitter, such as transmitter 118 of FIG. 1. The encoded video signals are stored to memory device 214 via system bus 206.

Host processor 208 accesses the encoded signals stored in memory device 214 via high-speed memory interface 216 and decodes the encoded video signals for display. Decoding the encoded video signals involves undoing the compression processing implemented by encoding system 100 of FIG. 1. Host processor 208 stores the decoded video signals to memory device 214 via memory interface 216 from where they are transmitted to display processor 202 via system bus 206. Alternatively, host processor 208 transmits the decoded video signals directly to display processor 202 via system bus 206. Display processor 202 processes the decoded video signals for display on monitor 204. The processing of display processor 202 includes digital-to-analog conversion of the decoded video signals. After being decoded by host processor 208 but before being D/A converted by display processor 202, the decoded video signals may be upsampled (e.g., from YV9 to YUV24), scaled, and/or color converted (e.g., from YUV24 to RGB24). Depending upon the particular embodiment, each of these processing steps may be implemented by either host processor 208 or display processor 202.

Referring again to FIG. 1, encoding system 100 is preferably a microprocessor-based personal computer (PC) system with a special purpose video-processing plug-in board. In particular, A/D converter 102 may be any suitable means for decoding and digitizing analog video signals. Capture processor 104 may be any suitable processor for capturing digitized video component signals as subsampled frames. In a preferred embodiment, A/D converter 102 and capture processor 104 are contained in a single plug-in board capable of being added to a microprocessor-based PC system.

Host processor 116 may be any suitable means for controlling the operations of the special-purpose video processing board and for performing video encoding. Host processor 116 is preferably an Intel® general-purpose microprocessor such as an Intel® i486™, Pentium™, or higher processor. System bus 114 may be any suitable digital signal transfer device and is preferably a Peripheral Component Interconnect (PCI) bus. Memory device 112 may be any suitable computer memory device and is preferably one or more dynamic random access memory (DRAM) devices. High-speed memory interface 110 may be any suitable means for interfacing between memory device 112 and host processor 116. Mass storage device 120 may be any suitable means for storing digital signals and is preferably a computer hard drive. Transmitter 118 may be any suitable means for transmitting digital signals to a remote receiver. Those skilled in the art will understand that the encoded video signals may be transmitted using any suitable means of transmission such as telephone line, RF antenna, local area network, or wide area network.

Referring again to FIG. 2, decoding system 200 is preferably a microprocessor-based PC system similar to the basic PC system of encoding system 100. In particular, host processor 208 may be any suitable means for decoding encoded video signals and is preferably an Intel® general purpose microprocessor such as an Intel(® i486™, Pentium™, or higher processor. System bus 206 may be any suitable digital signal transfer device and is preferably a PCI bus. Mass storage device 212 may be any suitable means for storing digital signals and is preferably a CD-ROM device or a hard drive. Receiver 210 may be any suitable means for receiving the digital signals transmitted by transmitter 118 of encoding system 100. Display processor 202 and monitor 204 may be any suitable devices for processing and displaying video signals (including the conversion of digital video signals to analog video and are preferably parts of a PC-based display system having a PCI graphics board and a 24-bit RGB monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encode and decode video signals. Those skilled in the art will understand that such a combined system may be used to display decoded video signals in real-time to monitor the capture and encoding of video signals.

In alternative embodiments of present invention, the video encode processing of an encoding system and/or the video decode processing of a decoding system may be assisted by a pixel processor, such as an Intel® i750™ processor, or other suitable component(s) to off-load processing from the host processor by performing computationally intensive operations.

Encode Processing

Figure 3:
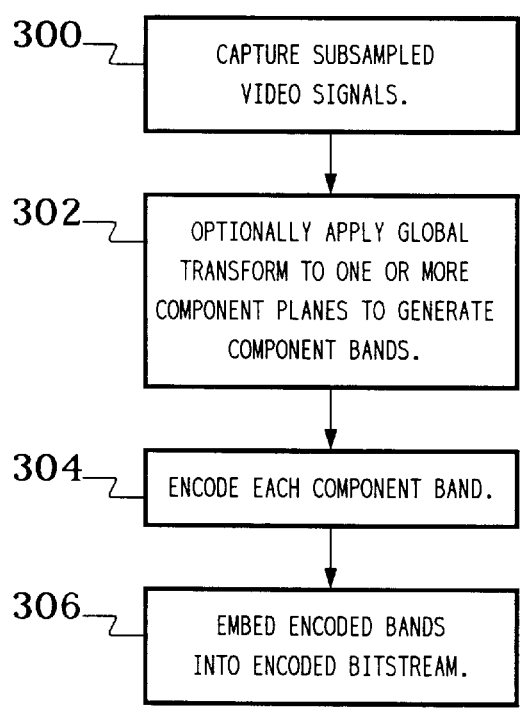
FIG. 3 is a process flow diagram of the compression processing implemented by the system of FIG. 1 for each frame of a video stream.

Referring now to FIG. 3, there is shown a process flow diagram of the compression processing implemented by encode system 100 of FIG. 1 for each frame of a video stream, according to a preferred embodiment of the present invention. The RGB24 signals generated by A/D converter 102 are converted to YVU24 signals by capture processor 104, and capture processor 104 subsamples the YVU24 signals to generate subsampled YVU9 signals (step 300 of FIG. 3).

Figure 4:
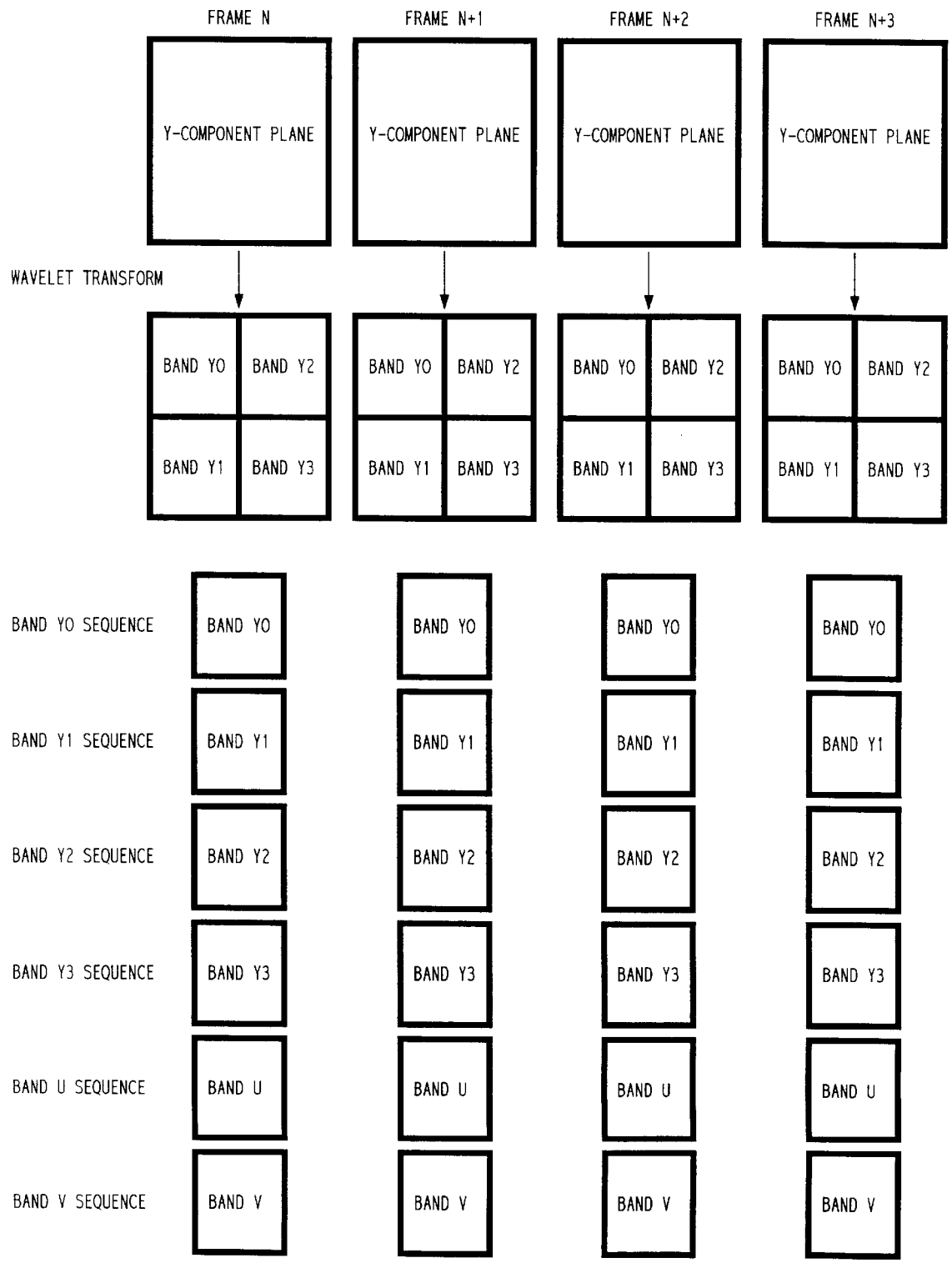
FIG. 4 shows a graphical representation of the six band sequences for the compression processing of FIG. 3.

Compression processing for each frame begins by optionally applying a global transform to one or more of the component planes to decompose the component planes into a plurality of bands (step 302). For example, a forward wavelet transform may be applied to the Y-component plane to globally decompose (i.e., transform) the Y-data into four separate bands of data, thereby producing a total of six bands of data for each frame: four Y-component bands, one U-component band, and one V-component band. FIG. 4 shows a graphical representation of the six band sequences. A preferred forward wavelet transform is described in further detail in the '1022 application in the section entitled "Wavelet Transform."

For purposes of this specification, the four Y-component bands are designated Band Y0, Band Y1, Band Y2, and Band Y3. The subsampled U-component plane (which is not wavelet transformed) is designated Band U, and the subsampled V-component plane (which is also not wavelet transformed) is designated Band V.

Encode processing is then applied to each of the bands of the current frame (step 304 of FIG. 3), where each band is part of a distinct band sequence (e.g., see FIG. 4). The encoded bands are then embedded into the compressed video bitstream to complete the compression processing for the current frame (step 306). Steps 300–306 of FIG. 3 are repeated for each frame of the video stream.

Figure 5:
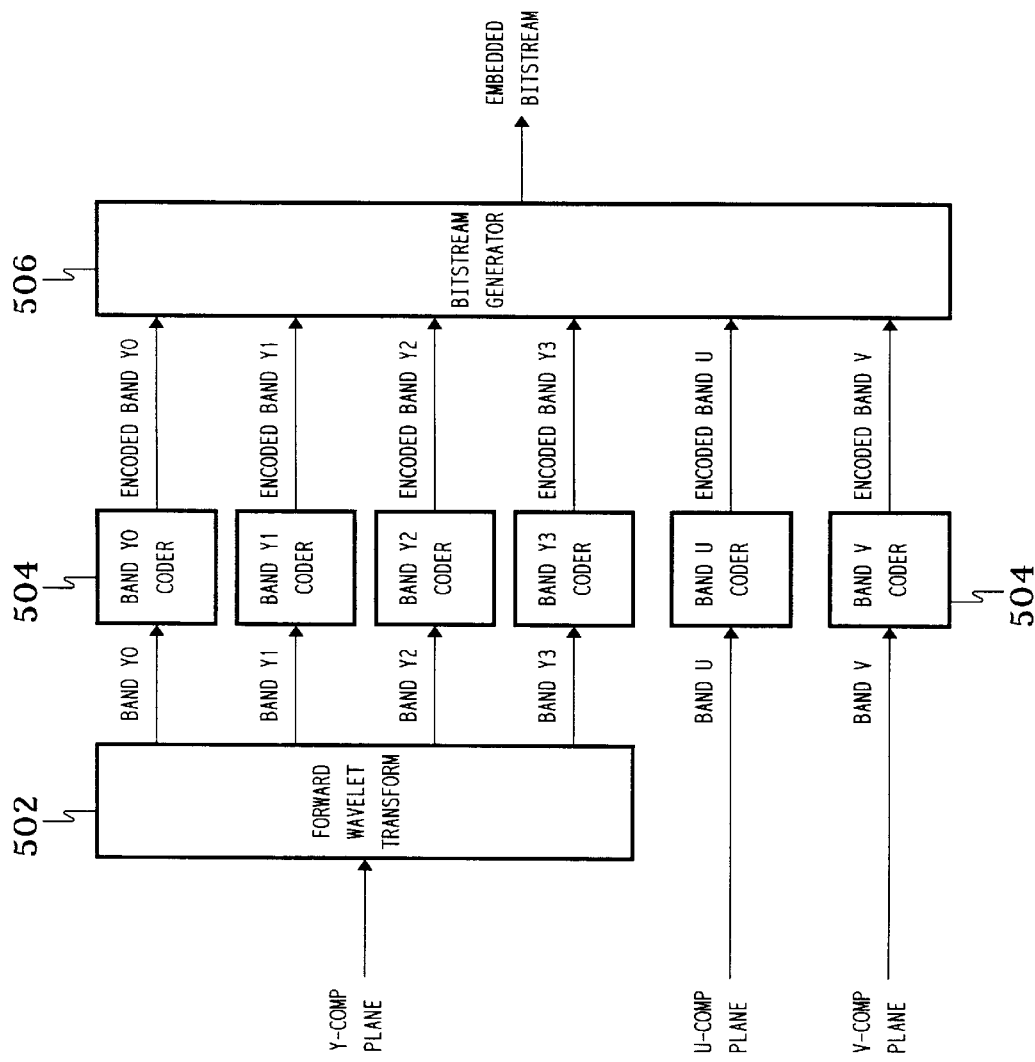
FIG. 5 is a block diagram of an encoder that implements the compression processing of FIG. 3.

Referring now to FIG. 5, there is shown a block diagram of an encoder that implements the compression processing of FIG. 3, when the forward wavelet transform is applied to only the Y-component plane. Transform 502 applies a forward wavelet transform to the Y-component plane of each frame to generate Bands Y0–Y3. Coders 504 encode the six bands of data and bitstream generator 506 embeds the resulting encoded bands into the encoded video bitstream. In a preferred embodiment, there is a single coder 504 that sequentially encodes the different bands.

Figure 6:
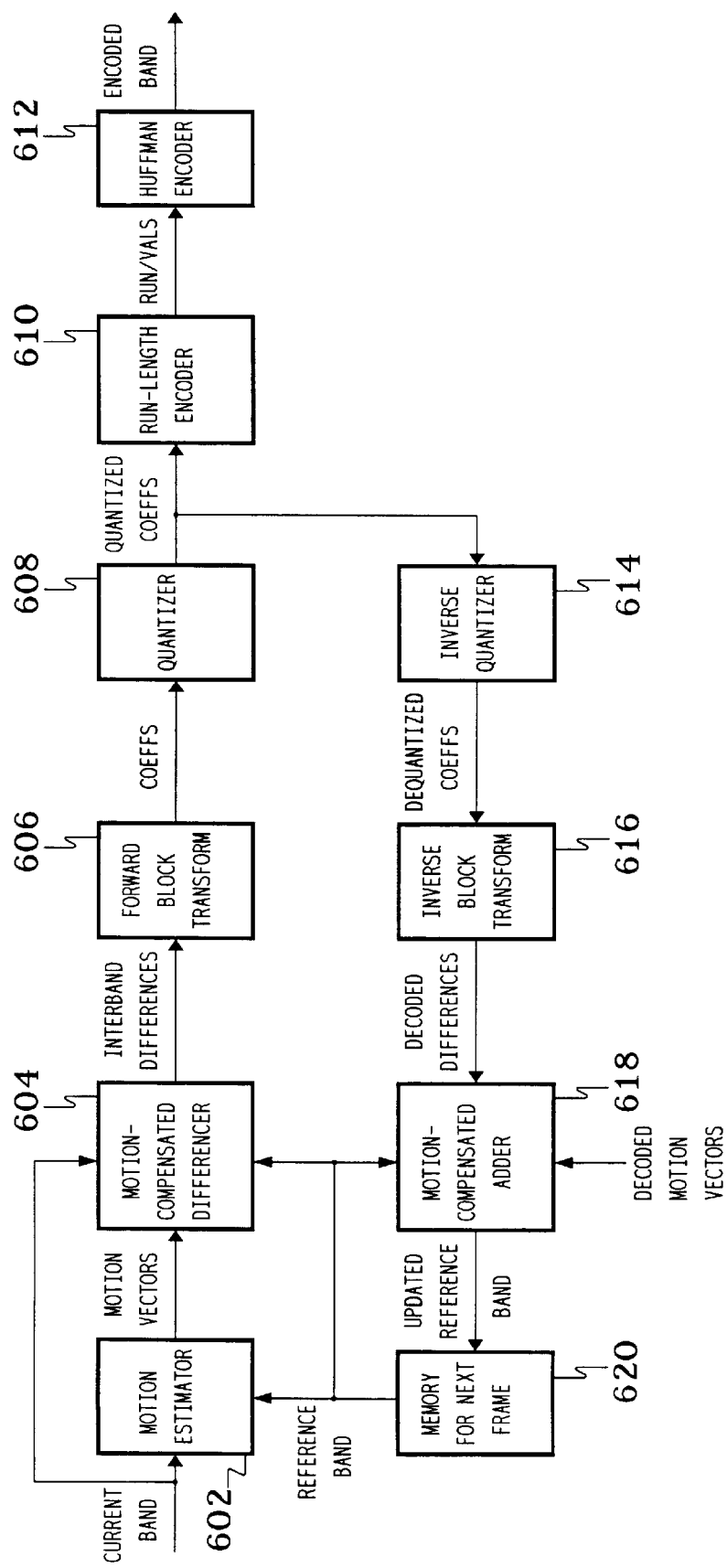
FIG. 6 is a block diagram of the encode processing of FIG. 3 which is applied to the difference blocks of each band of each inter-encoded frame of the video stream.

Referring now to FIG. 6, there is shown a block diagram of the processing of step 304 of FIG. 3 for encoding the difference blocks of each band of each inter-encoded frame of the video stream, according to one embodiment of the present invention. Those skilled in the art will understand that, in a video codec that employs interframe encoding, some of the frames are preferably encoded using only intraframe encoding. It will be further understood that each block of an inter-encoded frame may be encoded as either an intra block (i.e, using intraframe encoding) or a difference block (i.e., using interframe encoding).

In a preferred embodiment of the present invention, two different types of frames are encoded using interframe encoding (i.e., predictor frames and bi-directional frames)

and two different types of frames are encoded using intraframe encoding (i.e., key frames and intra frames).

A predictor (P) frame is encoded with respect to a reference frame that corresponds to a previous frame. Each block of a P frame is encoded as either a difference block (i.e., using uni-directional interframe encoding) or an intra block (i.e., using intraframe encoding). A bi-directional (B) frame is encoded with respect to two reference frames: a previous reference frame corresponding to a previous frame and a subsequent reference frame corresponding to a subsequent frame. Each block of a B frame is encoded as either a difference block with respect to the previous reference frame, a difference block with respect to the subsequent reference frame, or an intra block. Predictor and bi-directional frames are also collectively known as predicted frames. In one embodiment, a P frame may be used to generate a reference for other frames (e.g., a subsequent B or P frame, or a previous B frame), but a B frame may not be used to generate a reference for another frame. As such, B frames are disposable frames that a decoder may skip without adversely affecting any other frames.

Key (K) frames and intra (I) frames are both encoded without reference to any other frames. As such, each block of a K or I frame is encoded as an intra block. Both K and I frames may be used as references for subsequent B or P frames. In one embodiment, the difference between K and I frames is that an I frame may be used as a reference for a previous B frame, while a K frame may not.

The selection of how to encode a sequence of frames is preferably dictated by a set of parameters that specify a K frame interval, an I frame interval, a predicted frame interval, a frame rate, and whether bi-directional prediction is enabled. An example of a possible frame sequence is as follows:

K1 B2 B3 P4 B5 B6 P7 B8 B9 P10 B11 B12 P13 B14 B15 I16

In this sequence, K1 is an intra-encoded key frame; B2 and B3 are bi-directionally encoded with respect to K1 and P4; P4 is inter encoded with respect to K1; B5 and B6 are bi-directionally encoded with respect to P4 and P7; P7 is inter encoded with respect to P4; etc. This frame sequence is encoded and transmitted to the decoder in the following order:

K1 P4 B2 B3 P7 B5 B6 P10 B8 B9 P13 B11 B12 I16 B14 B15

This encoding order allows, for example, P4 to be decoded prior to B2 and B3, so that decoded P4 can be used as a reference in decoding B2 and B3. This decoding scheme introduces a one-frame latency in the decode process, because the decoded B frames are delayed by one frame during which the next I or P frame is decoded.

The encoding of intra blocks is equivalent to the encoding of difference blocks shown in FIG. 6, except that the motion estimation of 602 and motion-compensated differencing of 604 are not performed. Intra encoding is applied to all of the blocks of K and I frames as well as the intra blocks of P and B frames.

For P frames, motion estimator 602 of FIG. 6 performs motion estimation on macroblocks of the current band relative to a reference band to generate a set of motion vectors for the current band, where the P-frame reference band is generated by decoding the corresponding encoded band for a previous frame. (A block may correspond to an (8×8) set of pixels, while a macroblock may correspond to a (2×2) array of blocks (i.e., a (16×16) set of pixels).) For B frames, motion estimator 602 performs motion estimation on macroblocks of the current band with respect to two reference bands: one corresponding to a previous frame and one corresponding to a subsequent frame. The processing of motion estimator 602 is described in further detail in the '1022 application in the section entitled "Motion Estimation."

The motion vectors generated by motion estimator 602 are encoded into the compressed video bitstream. The motion vectors are preferably encoded using spatial differencing, in which each motion vector is encoded based on its difference from the previous motion vector (i.e., the adjacent motion vector following a particular scan sequence). The motion vector spatial differences are then Huffman encoded to generate the encoded motion vectors for the compressed video bitstream.

When motion vector inheritance is enabled, motion estimation is performed only on the first band of the Y-component plane (e.g., Band Y0 when the Y plane is globally decomposed using the wavelet transform). In that case, the motion vectors for the first Y band are used during motion-compensated differencing for all of the rest of the bands of the current frame. When motion vector inheritance is disabled, motion estimation is performed independently on each band of the current frame.

Those skilled in the art will understand that motion vector inheritance may result in substantially faster encoding and slightly faster decoding.

Motion-compensated differencer 604 applies the appropriate motion vectors to the reference band to generate a motion-compensated reference band. Differencer 604 also generates interband differences for the current band using the motion-compensated reference band and the current band.

In a K or I frame, each block is encoded as an intra block. In a P or B frame, some of the blocks may be encoded as difference blocks, while others may be encoded as intra blocks. In general, it is desirable to encode a block using the technique that results in the lowest number of bits of encoded data. One approach would be to encode each block using both intra-encoding and inter-encoding to determine which results in the fewer number of bits. This approach may be too time consuming for many applications.

In an alternative embodiment, the results of intra-encoding and inter-encoding are estimated using an Intra Grad measure and a SAD measure, respectively. The Intra Grad measure is generated for each macroblock by (1) generating the mean of the pixels in the macroblock and (2) then generating the sum of the absolute differences between that mean and the pixels of the macroblock. The SAD measure for each macroblock is the sum of the absolute values of the motion-compensated interband differences generated by differencer 604.

For P and B frames, each block of a macroblock is designated as an intra block, if the product of the Intra Grad measure and a specified constant is less than the SAD measure for that macroblock. Otherwise, the blocks of the macroblock are designated as a difference block.

The Intra Grad measure is also used to determine the quantization level for each macroblock of the current band. Each macroblock of the current band is assigned a value (QDelta) that corresponds to the deviation of the Q level (Qlevel) for the current macroblock from a global Q level (GlobalQuant).

The determination of the global Q level is described in further detail in the '1022 application in the section entitled "Bit-Rate Control." In a preferred embodiment:

QDelta=−8*log2((Gradi+2*MeanGrad)/(2*Gradi+MeanGrad)) if
(Qlevel<8) Qdelta=0 where:

Gradi is the Intra Grad measure for macroblock i; and
MeanGrad is the average Intra Grad for the entire band.

A forward block transform 606 is applied to each block to generate coefficients for the current band. In a preferred embodiment, transform 606 may selectively apply any of the following transforms: a DCT transform, a slant transform, a Haar transform, or a "Slaar" transform which is a hybrid of a slant transform and a Haar transform. The selected transform may be either a one-dimensional or two-dimensional transform, and may differ from band to band. In addition, transform 606 may be disabled for any band, so that the block signals are not transformed before quantization. The processing of forward block transform 606 is described in further detail in the '1022 application in the sections entitled "Block Transform" and "Decode Rate Control."

Those skilled in the art understand that, in order to intra encode a block of signals of the current band, motion estimator 602 and motion-compensated differencer 604 are skipped and the forward block transform 606 is applied directly to the block of signals, rather than to interframe difference signals.

Quantizer 608 quantizes the coefficients to generate quantized coefficients for the current band. Quantizer 608 applies uniform scalar quantization, wherein each coefficient is divided by a specified integer scale factor. The processing of quantizer 608 is described in further detail in the '1022 application in the section entitled "Adaptive Quantization."

Run-length encoder 610 transforms the quantized coefficients into run-length encoded (RLE) data. In a preferred embodiment, the RLE data for each block of quantized coefficients consist of a sequence of run/val pairs, where each run/val pair is a non-zero quantized coefficient followed by a value corresponding to a run of zero coefficients (i.e., coefficients that are quantized to zero). In a preferred embodiment, the run-length encoding follows an adaptively-generated pattern that tends to provide a long run of zero coefficients for the last run of the block. The processing of run-length encoder 610 is described in further detail in the '1022 application in the section entitled "Adaptive Run-Length Encoding."

Huffman encoder 612 applies Huffman-type entropy (a.k.a. statistical or variable-length) coding to the RLE data to generate the encoded data for the current band. The processing of Huffman encoder 612 is described in further detail later in this specification in the section entitled "Huffman Encoding."

The encode processing of FIG. 6 also includes the decoding of the encoded band to update the reference band used in encoding the corresponding band of another video frame. Since the run-length and Huffman encoding are lossless encoding steps, the decode loop of the encode processing preferably begins at inverse quantizer 614, which dequantizes the quantized coefficients to generate dequantized coefficients for the current band. It will be understood that the decoding processing of FIG. 6 is not performed for B frames, since B frames are not used to generate references for encoding other frames.

Inverse block transform 616 applies the inverse of forward block transform 606 to the dequantized coefficients to generate decoded differences for the current band. Motion-compensated adder 618 applies decoded motion vectors (generated by decoding the encoded motion vectors for the current band) to the current reference band to generate motion-compensated reference band data. Adder 618 also performs interband addition using the motion-compensated reference band data and the decoded differences to generate an updated reference band. The updated reference band is stored in memory 620 for use as the reference band in encoding the corresponding band of another video frame.

Those skilled in the art will understand that, when decoding the quantized coefficients for intra blocks, the outputs of inverse block transform 616 are the decoded pixels for the updated reference band and motion-compensated adder 618 is disabled.

Decode Processing

Figure 7:
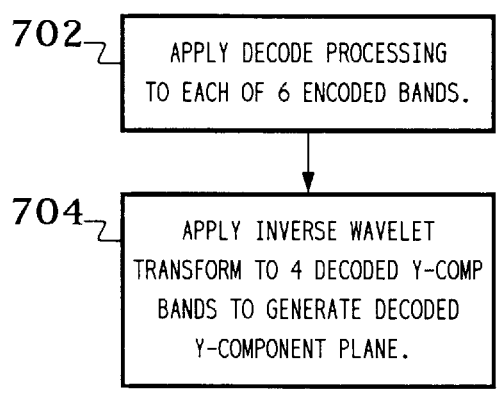
FIG. 7 is a process flow diagram of the decompression processing implemented by the decode system of FIG. 2 for each encoded frame of the encoded video bitstream.

Referring now to FIG. 7, there is shown a process flow diagram of the decompression processing implemented by decode system 200 of FIG. 2 for each encoded frame of the encoded video bitstream, according to a preferred embodiment of the present invention. For each encoded frame of the encoded video bitstream, decode processing is applied to each of the encoded bands (step 702 of FIG. 7). In the case where the Y-component plane was decomposed into four bands during encoding, an inverse transform is applied to the four decoded Y-component bands to generate the decoded Y-component plane (step 704). The decoded Y-component plane data are then processed with the decoded U- and V-component plane data to generate a decoded video image for display. A preferred inverse transform is described in further detail in the '1022 application in the section entitled "Wavelet Transform."

Figure 8:
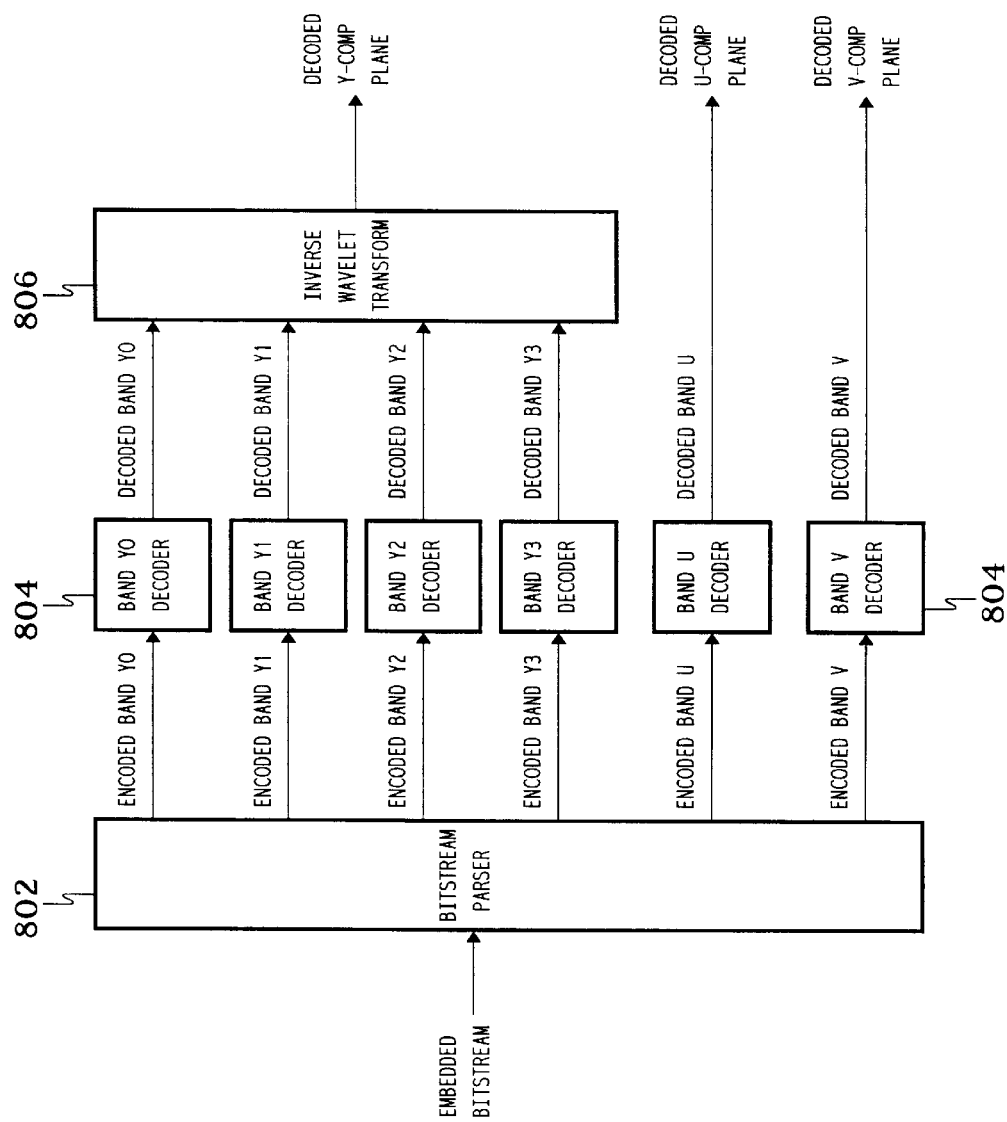
FIG. 8 is a block diagram of a decoder that implements the decompression processing of FIG. 7.

Referring now to FIG. 8, there is shown a block diagram of a decoder that implements the decompression processing of FIG. 7. Bitstream parser 802 parses the embedded bitstream into the encoded band sequences. Decoders 804 decode the bands of encoded data for each frame and inverse wavelet transform 806 applies the preferred inverse wavelet transform to the decoded Y-component bands to generate the decoded Y-component plane. In a preferred embodiment, there is a single decoder 804 that sequentially decodes the different encoded bands.

Figure 9:
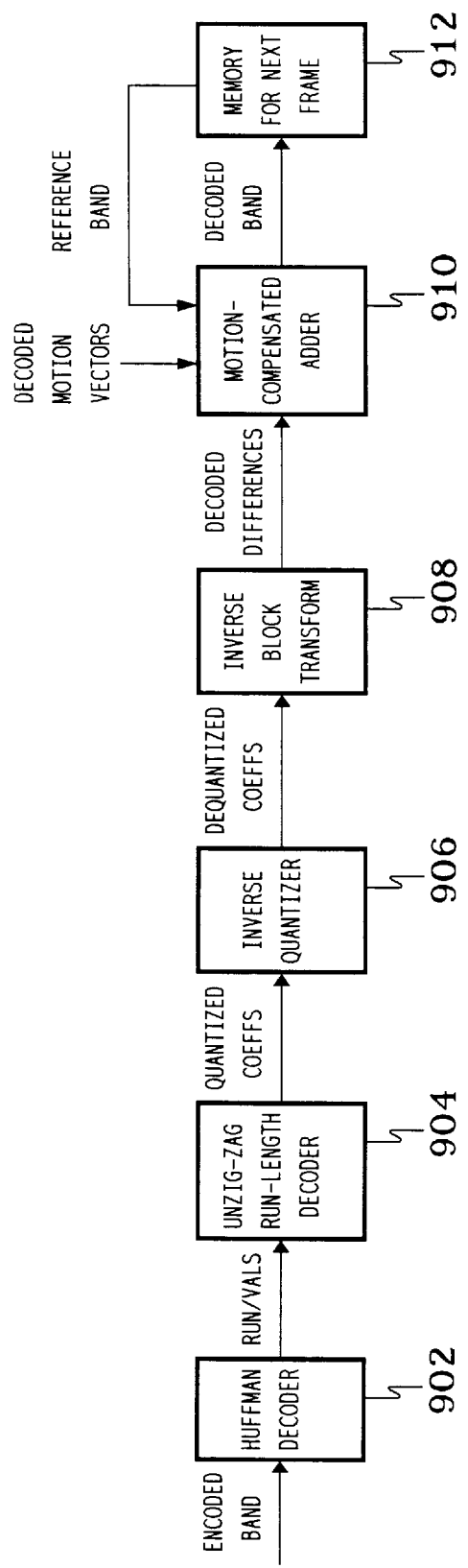
FIG. 9 is a block diagram of the decode processing of FIG. 7 that is applied to each encoded band of each interframe-encoded frame of the encoded video bitstream.

Referring now to FIG. 9, there is shown a block diagram of the decode processing of step 702 of FIG. 7 that is applied to the difference blocks of each encoded band of each inter-encoded frame of the encoded video bitstream, according to one embodiment of the present invention. The decode processing of FIG. 9 reverses the encode processing of FIG. 6. In particular, Huffman decoder 902 applies statistical decoding to the encoded data for the current band to reconstruct the run-length encoded run/val data. The processing of Huffman decoder 902 is described in further detail in the '1022 application in the section entitled "Statistical Decoding."

Run-length decoder 904 transforms the RLE data into quantized coefficients. Inverse quantizer 906 dequantizes the quantized coefficients to generate dequantized coefficients. Inverse block transform 908 applies the inverse of forward block transform 606 of FIG. 6 to the dequantized coefficients to generate decoded differences.

Motion-compensated adder 910 applies the decoded motion vectors to the reference band to generate motion-compensated reference band data, and performs inter-band addition using the motion-compensated reference band data and the decoded differences to generate the decoded data for the current band. The decoded band is then stored in memory 912 for use as the reference band for decoding the corresponding band of another video frame. If the decoded band corresponds to a Y-component band, the decoded band is also used to reconstruct the decoded Y-component plane (step 704 of FIG. 7). Otherwise, the decoded band is either the decoded U- or V-component plane. In any case, the decoded band is used to generate the decoded image for display.

The decoding for intra blocks is equivalent to the decoding for difference blocks shown in FIG. 9, except that the motion-compensated adding of 910 is not performed. In that case, the outputs of inverse block transform 908 are the decoded pixels for the updated reference band. Intra decoding is applied to all of the blocks of K and I frames as well as the intra blocks of D and B frames.

Huffman Encoding

According to a preferred embodiment of the present invention, Huffman encoding comprises two phases: an off-line training phase and a on-line encoding phase. During the off-line training phase, a set of Huffman tables are generated based on a set of training video sequences. The generated set of Huffman tables are then programmed into both the encoder and the decoder. During the on-line encoding phase, the encoder decides which of the predefined Huffman tables to select to encode each different set of video signals of one or more video sequences to be compressed for transmission and/or storage. The Huffman table selection is explicitly encoded into the generated compressed bitstream in order to notify the decoder which table to use to decode the VL codes in the bitstream. These two phases are described in the next two sections of this specification.

Generation of Huffman Tables

Figure 10:
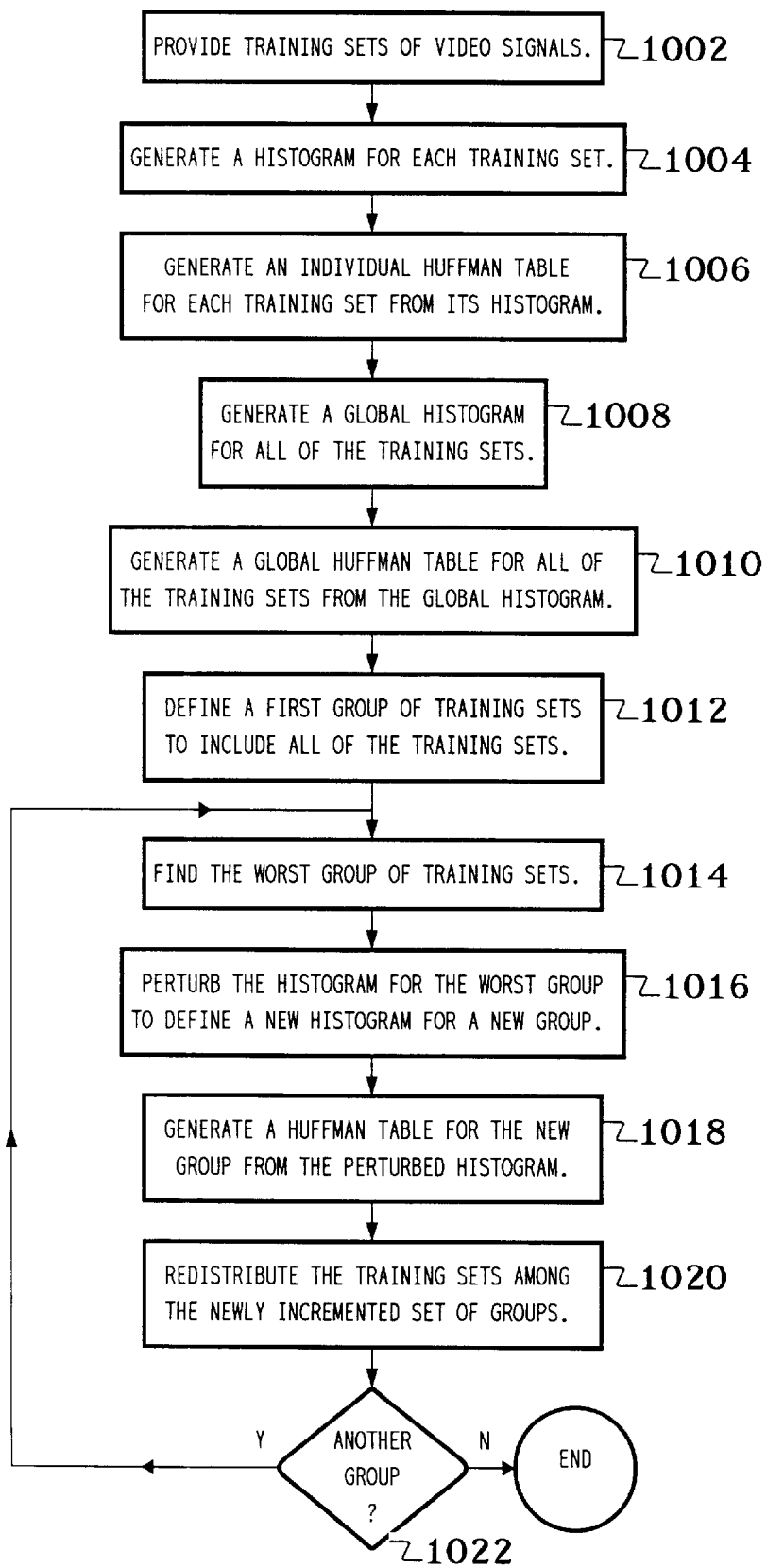
FIG. 10 is a flow diagram of the training processing implemented off line to generate a set of Huffman tables to be used for future on-line encoding of video sequences, according to a preferred embodiment of the present invention.

Referring now to FIG. 10, there is shown a flow diagram of the training processing implemented off line to generate a set of Huffman tables to be used for future on-line encoding of video sequences, according to a preferred embodiment of the present invention. For a given set of training video sequences (step 1002 of FIG. 10), a histogram is generated for each set of video signals in the training set (step 1004) and a Huffman table is generated for each histogram (step 1006). Each set of video signals preferably corresponds to a band of one of the video frames of one of the video sequences, although other groupings of video signals (larger or smaller) may alternatively be used. The training sets are preferably selected to be representative of the types of video sequences to be encoded during on-line processing.

In one embodiment, each Huffman table generated in step 1006 is the generalized Huffman table that optimally encodes any set of signals that has a statistical distribution equal to the histogram used to generate that Huffman table. In an alternative embodiment, the Huffman table is a structured table (i.e., a codebook that follows a particular syntactical pattern). In that case, the Huffman table is preferably that table which optimally encodes the corresponding set of signals given the constraints of the specified syntactical pattern.

A global histogram is also generated for the entire set of training sequences (step 1008) and a corresponding global Huffman table is generated from that global histogram (step 1010). Those skilled in the art will understand that the global histogram may be generated as the sum of the histograms for the different sets of video signals. The global Huffman table is preferably the optimal generalized Huffman table corresponding to the global histogram, independent of whether the Huffman tables generated in step 1006 for the individual histograms are generalized or structured Huffman tables. Alternatively, if the individual Huffman tables are structured tables, the global Huffman table may also be a structured table following the same syntactical pattern.

Under a preferred embodiment of the present invention, the process of generating a specified number (N) of Huffman tables that optimally encode the sets of video signals of the training sequences is an iterative process that begins by treating all of the training sets of video signals as if they were members of a single group of sets to be encoded by a single Huffman table. With each iteration, a new group is created and the training sets of video signals are redistributed among the newly incremented set of groups. The iteration is repeated until N groups of training sets are generated. At that time, N histograms will have been generated, one for each group of training sets.

In particular, the initial single group of training sets is defined to include all of the training sets of video signals (step 1012). The worst group of training sets is then identified (step 1014). In general, the worst group is defined to be the group of training sets that is most inefficiently encoded using a single Huffman table, where that single Huffman table is generated from the composite histogram for that group of training sets. The composite histogram may be generated as the sum of the histograms for each of the training sets in the group. A preferred measure M of the efficiency with which a particular group of T training sets may be encoded using a single Huffman table is given as follows:

$$M = B\left(\sum_{i}^{T} h_i\right) - \sum_{i}^{T} [B(h_i)] \quad (1)$$

where $h_i$ is the histogram for the ith training set, the sum of the $h_i$ is the composite histogram for the group of T training sets, and B is a function that returns the number of bits required to encode the one or more training sets corresponding to the histogram operand using the Huffman table generated from that histogram. Thus, the measure M is the difference in number of bits between encoding the particular group of training sets using a single Huffman table versus encoding each of the training sets using the individual Huffman table generated for each training set.

In general, the function B generates the number of bits required to encode a given set of video signals using a specified Huffman table. One way to generate that number of bits is actually to encode the video signals using the Huffman table and count of the number of bits in the bitstream.

In an alternative preferred embodiment of the present invention, the number of bits to encode is generated without performing the actual encoding. The Huffman table for a given set of video signals defines the number of bits required to encode each of the possible fixed-length signal values. The histogram for the given set of video signals defines how many times each fixed-length signal value appears in the set. Thus, the number of bits required to encode a given set of video signals using a given Huffman table is the sum of the products of the frequency of each signal value (derived from the histogram) times the code length associate with that signal value (derived from the Huffman table). As such, the function B may be defined as follows:

$$B = \Sigma f_j l_j \quad (2)$$

where $f_j$ is the frequency of signal value j and $l_j$ is the code length in bits for the VL code associated with signal value j.

If the measure M for a first group of training sets is less than the measure M for a second group of training sets, then the first group can be more efficiently encoded using a single Huffman table than can the second group. In that case, the second group is said to constitute a worse grouping of training sets than the first group. During the first iterative pass of FIG. 10, where there is only one group (containing all of the training sets), that one group is defined to be the worst group in step 1014.

After identifying the worst group of the current set of groups in step 1014, the histogram for the worst group is perturbed to generate and define a new histogram for a newly created group of training sets (step 1016). In one possible embodiment, the perturbation to the selected histogram is a random perturbation. In an alternative preferred embodiment, where the general shape of the ideal statistical distribution for the training sets of video signals is known, the perturbation may be perturbed in a predefined manner. For example, the general shape for the ideal statistical pattern for encoding quantized transform coefficients may be a Laplacian distribution with the greatest probability at 0 and decreasing probability with increasing values. In that case, the selected histogram is preferably perturbed towards that ideal shape.

The selected histogram may be perturbed in the following manner. Find the mean frequency of the histogram. For each value represented in the histogram, if the frequency of that value is less than the mean frequency, then increase the frequency by a fixed percentage (e.g., 10%). If the frequency of the value is greater than the mean frequency, then decrease the frequency by the same fixed percentage. If the frequency of the value is equal to the mean frequency, then leave the frequency unchanged. Those skilled in the art will understand that the perturbed histogram will represent a more uniform distribution than the original histogram.

The Huffman table corresponding to the perturbed histogram is then generated for the new group of training sets (step 1018), while retaining the Huffman tables for the unperturbed histograms of the old groups. The training sets are then redistributed among the newly incremented set of groups (step 1020). The processing for the redistribution of training sets of step 1020 is described in further detail with regard to FIG. 11. If the number of groups has reached the specified number N of desired groups (step then the generation of the set of N Huffman tables is complete. Otherwise, processing returns to repeat steps 1014–1020 to add another group.

Figure 11:
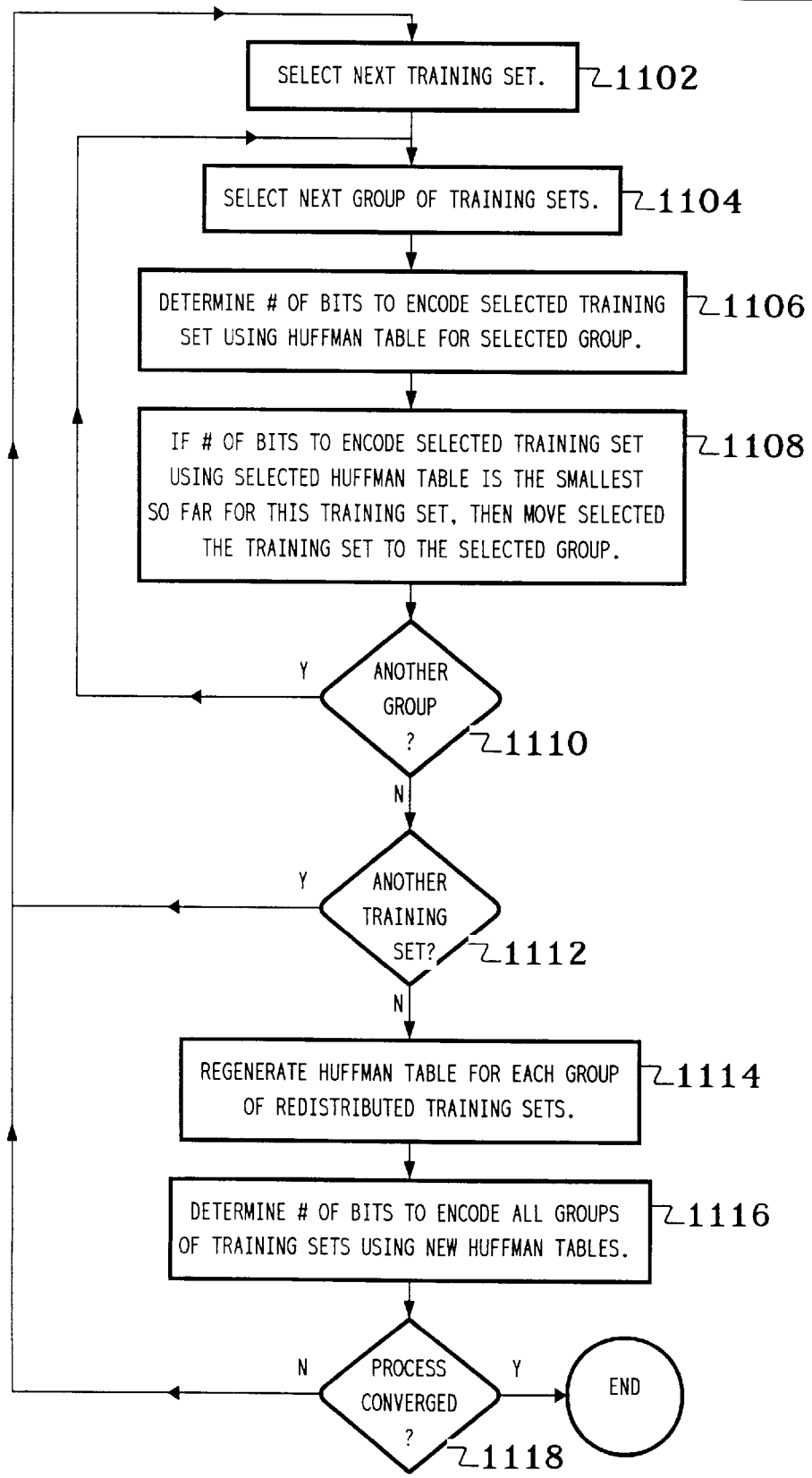
FIG. 11 is a flow diagram of the processing of FIG. 10 performed to redistribute the training sets among the newly incremented set of groups.

Referring now to FIG. 11, there is shown a flow diagram of the processing performed to redistribute the training sets among the newly incremented set of groups (step 1020 of FIG. 10), according to a preferred embodiment of the present invention. The training sets are redistributed among the groups by determining how many bits it takes to encode each training set using the Huffman table associated with each group and moving the training set to the group that does the best job (i.e., the fewest number of bits). Since the Huffman table for a given group is generated from the histograms for the training sets in that group, redistributing the training sets among the various groups will affect the Huffman tables for those groups. The preferred redistribution process takes this into account by iteratively (1) redistributing the training sets and (2) updating the Huffman tables, until no training sets change groups. At that point, the number of bits to encode will not change from the previous iteration loop and the redistribution processing is terminated.

In particular, the next training set is selected (step 1102 of FIG. 11) and the next group of training sets is selected (step 1104). It is then determined how many bits B are required to encode the selected training set using the Huffman table corresponding to the selected group as shown in Equation (2) (step 1106). If the number of bits used to encode the selected training set using the selected Huffman table is the smallest so far for this training set, then move the selected training set to the selected group (step 1108). If there is another group to compare to for the selected training set (step 1110), then return to step 1104. Otherwise, the selected training set has been compared to all of the existing groups and processing continues to step 1112. If there is another training set to test (step 1112), then return to step 1102. Otherwise, all of the training sets have been tested and processing continues to step 1114.

Processing reaches step 1114 after all of the training sets have been tested using the Huffman tables for all of the groups. Since one or more training sets may have been moved from one group to another, the Huffman tables for each group of redistributed training sets is regenerated to reflect the updated composition of those groups (step 1114). Using Equation (2), it is then determined how many bits are required to encode all of the training sets using the corresponding Huffman tables (step 1116). If the total number of bits has not decreased as compared to the previous pass through the iteration loop, then the process is said to have converged and the redistribution process is complete. Otherwise, if the process has not converged (step 1118), then processing returns to step 1102 to repeat the iteration loop using the updated Huffman tables.

The generation of Huffman tables using a preferred embodiment of the present invention has advantages over other conventional methods. In general, the set of Huffman tables generated under the present invention may do a better job encoding video signals than those tables generated under other methods. One reason for this is that statistical redundancies between the histograms used to generate the tables are exploited. In general, there are no arbitrary constraints (e.g., quantization level) on how histograms should be grouped. The present invention provides a compact Huffman table set (i.e., fewer tables required to achieve similar performance). The closer the training sets represent the signals to be encoded during on-line processing, the better will the resulting set of generated Huffman tables encode those signals.

As described above, in a preferred embodiment, the efficiency with which a Huffman table encodes a group of training sets is characterized by the measure of Equation (1). Those skilled in the art will understand that other measures of efficiency may alternatively be used. For example, the efficiency could be characterized in terms of the entropies of the different groups of training sets. In this case, it is not necessary to generate a separate Huffman table for each individual training set.

Selection of Huffman Tables

The set of Huffman tables generated during off-line training processing are programmed into both the encoder and the decoder. During on-line encoding, the encoder selects one of the Huffman tables from the set for each set of video signals to be encoded. In a preferred embodiment, a different Huffman table may be selected for each different band of each frame of the video sequences to be encoded. The table selection is encoded explicitly into the bitstream as a table identification number within the band header. The decoder recovers the table identification number from the band header to know which Huffman table to use to decode the variable-length codes in the bitstream for that band.

In a preferred embodiment, the option also exists to encode a different Huffman table explicitly into the bitstream. This option may be selected when the different table is determined to provide better results (i.e., a smaller bitstream) than any of the predefined tables, even with the additional bits required to encode the different table into the bitstream. Attention is also preferably paid to the processing demands on the decoder to recover the different table from the bitstream. If those demands are too great, then the different table may not be used even if it provides a smaller bitstream.

Figure 12:
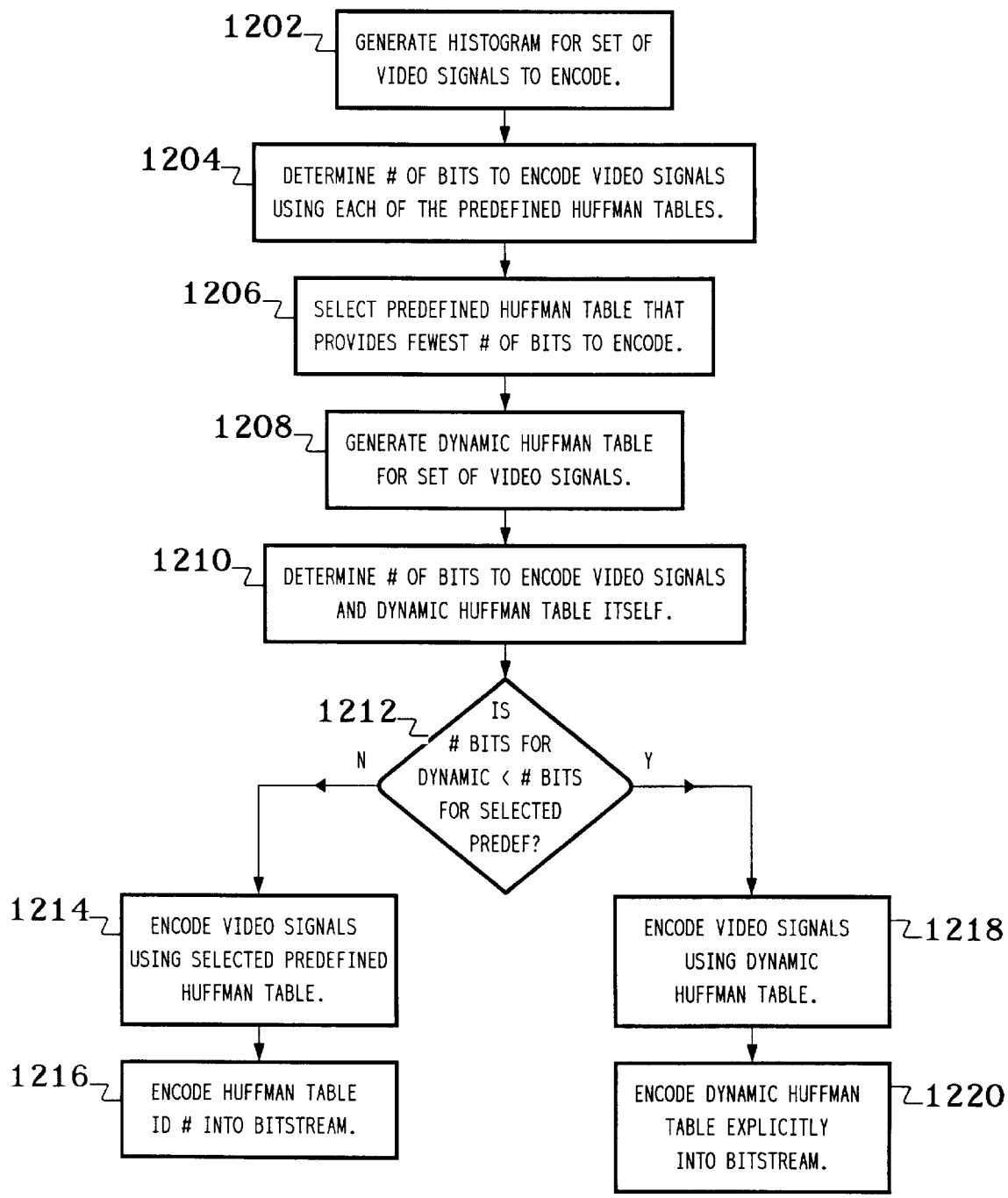
FIG. 12 is a flow diagram of the processing performed to select a Huffman table from a set of predefined Huffman tables to be used for on-line encoding of video signals, according to a preferred embodiment of the present invention.

Referring now to FIG. 12, there is shown a flow diagram of the processing performed to select a Huffman table from a set of predefined Huffman tables to be used for on-line encoding of video signals, according to a preferred embodiment of the present invention. The processing of FIG. 12 is a preferred embodiment of the processing of Huffman encoder 612 of FIG. 6.

In particular, for the current set of video signals to be encoded, a histogram is generated characterizing the frequency of occurrence of the signals to be encoded (step 1202 of FIG. 12). Using this histogram, the number of bits B required to encode the current set of video signals is determined for each of the predefined Huffman tables, using Equation (2) (step 1204). The predefined Huffman table associated with the fewest number of bits to encode is selected as the best predefined table (step 1206).

A dynamic Huffman table is then generated from the histogram for the current set of video signals (step 1208). The number of bits required to encode both the current set of video signals and the dynamic Huffman table itself is then determined (step 1210). The dynamic table is preferably the one that optimally encodes the current set, given any constraints such as a specific syntactical structure for the table. Those skilled in the art will understand that a structured Huffman table may require fewer bits for explicit representation in a bitstream than a generalized Huffman table which may otherwise do a better job encoding the current set. A goal is to provide the fewest total number of bits in the bitstream including those required to represent the dynamic table.

If using the dynamic Huffman table, including the cost of explicitly encoding the table in the bitstream, would result in a smaller bitstream than using the best predefined table selected in step 1206, then the current set of video signals is encoded using the dynamic Huffman table (step 1218) and the dynamic Huffman table is explicitly encoded into the bitstream (step 1220). Otherwise, the best predefined table does a better job. In that case, the current set of video signals are encoded using the selected predefined table (step 1214) and the identification number for that table is explicitly encoded into the bitstream (step 1216).

In the examples presented above, the present invention was explained in the context of encoding and decoding video and other image signals. Those skilled in the art will understand that the present invention can be used in other processing that relies on variable-length encoding signals that are representative of or constituting physical activity or objects.

The present invention can be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented process for encoding signals, comprising the steps of:
   (a) generating a histogram for a set of signals;
   (b) using the histogram to select a Huffman table from a set of two or more pre-defined Huffman tables;
   (c) generating a dynamic Huffman table for the set of signals;
   (d) using the dynamic Huffman table to determine a number of bits to encode a set of signals using the dynamic Huffman table including a number of bits to encode the dynamic Huffman table;
   (e) encoding the set of signals using the dynamic Huffman table, if the number of bits to encode the set of signals using the dynamic Huffman table including the number of bits to encode the dynamic Huffman table is less than the number of bits to encode the set of signals using the selected pre-defined Huffman table;
   (f) encoding the set of signals using the selected pre-defined Huffman table, if the number of bits to encode the set of signals using the dynamic Huffman table including the number of bits to encode the dynamic Huffman table is not less than the number of bits to encode the set of signals using the selected pre-defined Huffman table; and
   (g) generating an encoded bit stream from the variable-length encoded signals.

2. The process of claim 1, wherein the signals comprise video signals.

3. The process of claim 1, wherein step (b) comprises the steps of:
   (1) using the histogram to determine a number of bits to encode the set of signals using each of the predefined Huffman tables; and
   (2) selecting the predefined Huffman table corresponding to the fewest number of bits to encode.

4. The process of claim 3, wherein step (b)(1) comprises the step of generating, for each predefined Huffman table, a sum of products of a frequency of occurrence of each signal value of the set of signals and a codelength of each corresponding code for the predefined Huffman table.

5. The process of claim 1, wherein the processing of steps (a)–(g) are repeated for subsequent sets of signals.

6. The process of claim 1, wherein step (g) comprises the steps of:
   (1) encoding the dynamic Huffman table into the encoded bitstream, if the dynamic Huffman table is used to encode the set of signals; and
   (2) encoding a table identification number for the selected predefined Huffman table, if the selected predefined Huffman table is used to encode the set of signals.

7. The process of claim 6, wherein:
   the signals comprise video signals;
   step (b) comprises the steps of:
   (1) using the histogram to determine a number of bits to encode the set of signals using each of the pre-defined Huffman tables; and (2) selecting the predefined Huffman table corresponding to the fewest number of bits to encode;

step (b)(1) comprises the step of generating, for each predefined Huffman table, a sum of products of a frequency of occurrence of each signal value of the set of signals and a codelength of each corresponding code for the predefined Huffman table; and the processing of steps (a)–(g) are repeated for subsequent sets of signals.

8. An apparatus for encoding signals, comprising:

(a) means for generating a histogram for a set of signals;

(b) means for using the histogram to select a Huffman table from a set of 2 or more pre-defined Huffman tables;

(c) means for generating a dynamic Huffman table for the set of signals;

(d) means for using the dynamic Huffman table to determine a number of bits to encode the set of signals using the dynamic Huffman table including a number of bits to encode the dynamic Huffman table;

(e) means for encoding the set of signals using the dynamic Huffman table, if the number of bits to encode the set of signals using the dynamic Huffman table including the number of bits to encode the dynamic Huffman table is less than the number of bits to encode the set of signals using the pre-defined Huffman table;

(f) means for encoding the set of signals using the selected pre-defined Huffman table, if the number of bits to encode the set of signals using the dynamic Huffman table including the number of bits to encode the dynamic Huffman table is not less than the number of bits to encode the set of signals using the selected pre-defined Huffman table; and (g) means for generating an encoded bit stream from the variable-length encoded signals.

9. The apparatus of claim 8, wherein the signals comprise video signals.

10. The apparatus of claim 8, wherein means (b):

uses the histogram to determine a number of bits to encode the set of signals using each of the predefined Huffman tables; and selects the predefined Huffman table corresponding to the fewest number of bits to encode.

11. The apparatus of claim 10, wherein means (b) generates, for each predefined Huffman table, a sum of products of a frequency of occurrence of each signal value of the set of signals and a codelength of each corresponding code for the predefined Huffman table.

12. The apparatus of claim 8, wherein the processing of means (a)–(g) are repeated for subsequent sets of signals.

13. The apparatus of claim 8, wherein means (g):

encodes the dynamic Huffman table into the encoded bitstream, if the dynamic Huffman table is used to encode the set of signals; and encodes a table identification number for the selected predefined Huffman table, if the selected predefined Huffman table is used to encode the set of signals.

14. The apparatus of claim 13, wherein:

the signals comprise video signals;

means (b):

uses the histogram to determine a number of bits to encode the set of signals using each of the predefined Huffman tables; and selects the predefined Huffman table corresponding to the fewest number of bits to encode, wherein means (b) generates, for each predefined Huffman table, a sum of products of a frequency of occurrence of each signal value of the set of signals and a codelength of each corresponding code for the predefined Huffman table; and the processing of means (a)–(g) are repeated for subsequent sets of signals.

15. A storage medium encoded with machine-readable computer program code for encoding signals, comprising:

(a) means for causing a computer to generate a histogram for a set of signals;

(b) means for causing the computer to use the histogram to select a Huffman table from a set of two or more pre-defined Huffman tables;

(c) means for causing the computer to generate a dynamic Huffman table for the set of signals;

(d) means for causing the computer to use the dynamic Huffman table to determine a number of bits to encode the set of signals using the dynamic Huffman table including a number of bits to encode the dynamic Huffman table;

(e) means for causing the computer to encode the set of signals using the dynamic Huffman table, if the number of bits to encode the set of signals using the dynamic Huffman table including the number of bits to encode the dynamic Huffman table is less than the number of bits to encode the set of signals using the selected pre-defined Huffman table;

(f) means for causing the computer to encode the set of signals using the selected pre-defined Huffman table, if the number of bits to encode the set of signals using the dynamic Huffman table including the number of bits to encode the dynamic Huffman table is not less than the number of bits to encode the set of signals using the selected pre-defined Huffman table; and (g) means for causing the computer to generate an encoded bit stream from the variable-length encoded signals.

16. The storage medium of claim 15, wherein the signals comprise video signals.

17. The storage medium of claim 15, wherein means (b) causes the computer to:

use the histogram to determine a number of bits to encode the set of signals using each of the predefined Huffman tables; and select the predefined Huffman table corresponding to the fewest number of bits to encode.

18. The storage medium of claim 17, wherein means (b) causes the computer to generate, for each predefined Huffman table, a sum of products of a frequency of occurrence of each signal value of the set of signals and a codelength of each corresponding code for the predefined Huffman table.

19. The storage medium of claim 15, wherein the processing of means (a)–(g) are repeated for subsequent sets of signals.

20. The storage medium of claim 15, wherein means (g) causes the computer to:

encode the dynamic Huffman table into the encoded bitstream, if the dynamic Huffman table is used to encode the set of signals; and encode a table identification number for the selected predefined Huffman table, if the selected predefined Huffman table is used to encode the set of signals.

21. The storage medium of claim 20, wherein:

the signals comprise video signals;

means (b) causes the computer to:
use the histogram to determine a number of bits to encode the set of signals using each of the predefined Huffman tables; and
select the predefined Huffman table corresponding to the fewest number of bits to encode, wherein means (b) causes the computer to generate, for each predefined Huffman table, a sum of products of a frequency of occurrence of each signal value of the set of signals and a codelength of each corresponding code for the predefined Huffman table; and the processing of means (a)–(g) are repeated for subsequent sets of signals.

\* \* \* \* \*